United States Patent
Bao et al.

(10) Patent No.: US 10,439,043 B2
(45) Date of Patent: Oct. 8, 2019

(54) FORMATION OF SELF-ALIGNED BOTTOM SPACER FOR VERTICAL TRANSISTORS

(71) Applicant: International Business Machines Corporation, Armonk, NY (US)

(72) Inventors: Ruqiang Bao, Niskayuna, NY (US); Hemanth Jagannathan, Niskayuna, NY (US); Choonghyun Lee, Rensselaer, NY (US); Shogo Mochizuki, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/280,100

(22) Filed: Feb. 20, 2019

(65) Prior Publication Data

US 2019/0189774 A1    Jun. 20, 2019

Related U.S. Application Data

(62) Division of application No. 15/848,861, filed on Dec. 20, 2017, now Pat. No. 10,276,687.

(51) Int. Cl.
| | |
|---|---|
| *H01L 21/02* | (2006.01) |
| *H01L 29/66* | (2006.01) |
| *H01L 21/8238* | (2006.01) |
| *H01L 27/092* | (2006.01) |
| *H01L 29/786* | (2006.01) |

(Continued)

(52) U.S. Cl.
CPC .... *H01L 29/66553* (2013.01); *H01L 21/0234* (2013.01); *H01L 21/02164* (2013.01); *H01L 21/02175* (2013.01); *H01L 21/02255* (2013.01); *H01L 21/02332* (2013.01); *H01L 21/02532* (2013.01); *H01L 21/823814* (2013.01); *H01L 21/823885* (2013.01); *H01L 27/092* (2013.01); *H01L 29/0653* (2013.01); *H01L 29/42392* (2013.01); *H01L 29/78618* (2013.01); *H01L 29/78642* (2013.01)

(58) Field of Classification Search
CPC .......... H01L 29/7827; H01L 29/66666; H01L 29/78642; H01L 29/42392
See application file for complete search history.

(56) References Cited

U.S. PATENT DOCUMENTS

| | | | | |
|---|---|---|---|---|
| 2009/0166770 A1* | 7/2009 | Gluschenkov | ...... | H01L 21/2807 257/412 |
| 2014/0175543 A1* | 6/2014 | Glass | .............. | H01L 21/823431 257/337 |
| 2015/0311320 A1* | 10/2015 | Cheng | ................ | H01L 29/66795 438/157 |

OTHER PUBLICATIONS

List of IBM Patents or Patent Applications Treated as Related; (Appendix P), Filed Feb. 20, 2019, 2 pages.

(Continued)

*Primary Examiner* — Jaehwan Oh
(74) *Attorney, Agent, or Firm* — Cantor Colburn LLP; Vazken Alexanian

(57) ABSTRACT

A method of fabricating a semiconductor device includes forming a fin on a substrate. Source/drain regions are arranged on the substrate on opposing sides of the fin. The method includes depositing a semiconductor layer on the source/drain regions. The method includes depositing a germanium containing layer on the fin and the semiconductor layer. The method further includes applying an anneal operation configured to chemically react the semiconductor layer with the germanium containing layer and form a silicon oxide layer.

20 Claims, 12 Drawing Sheets

(51) Int. Cl.
*H01L 29/423* (2006.01)
*H01L 29/06* (2006.01)

(56) References Cited

OTHER PUBLICATIONS

Ruqiang Bao, et al., "Formation of Self-Aligned Bottom Spacer for Vertical Transistors", U.S. Appl. No. 15/848,861, filed Dec. 20, 2017.

* cited by examiner

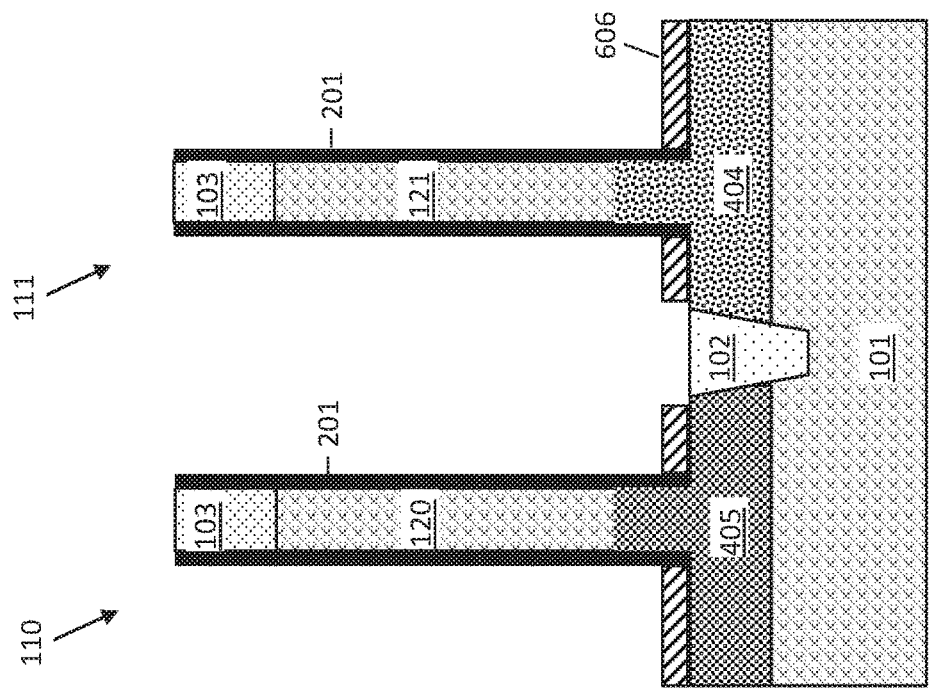
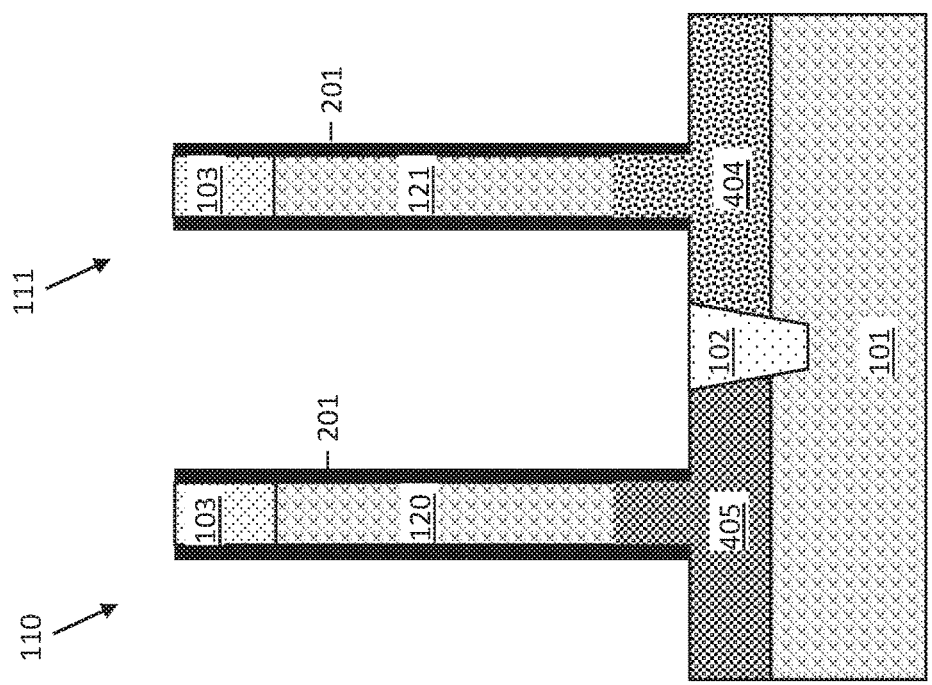

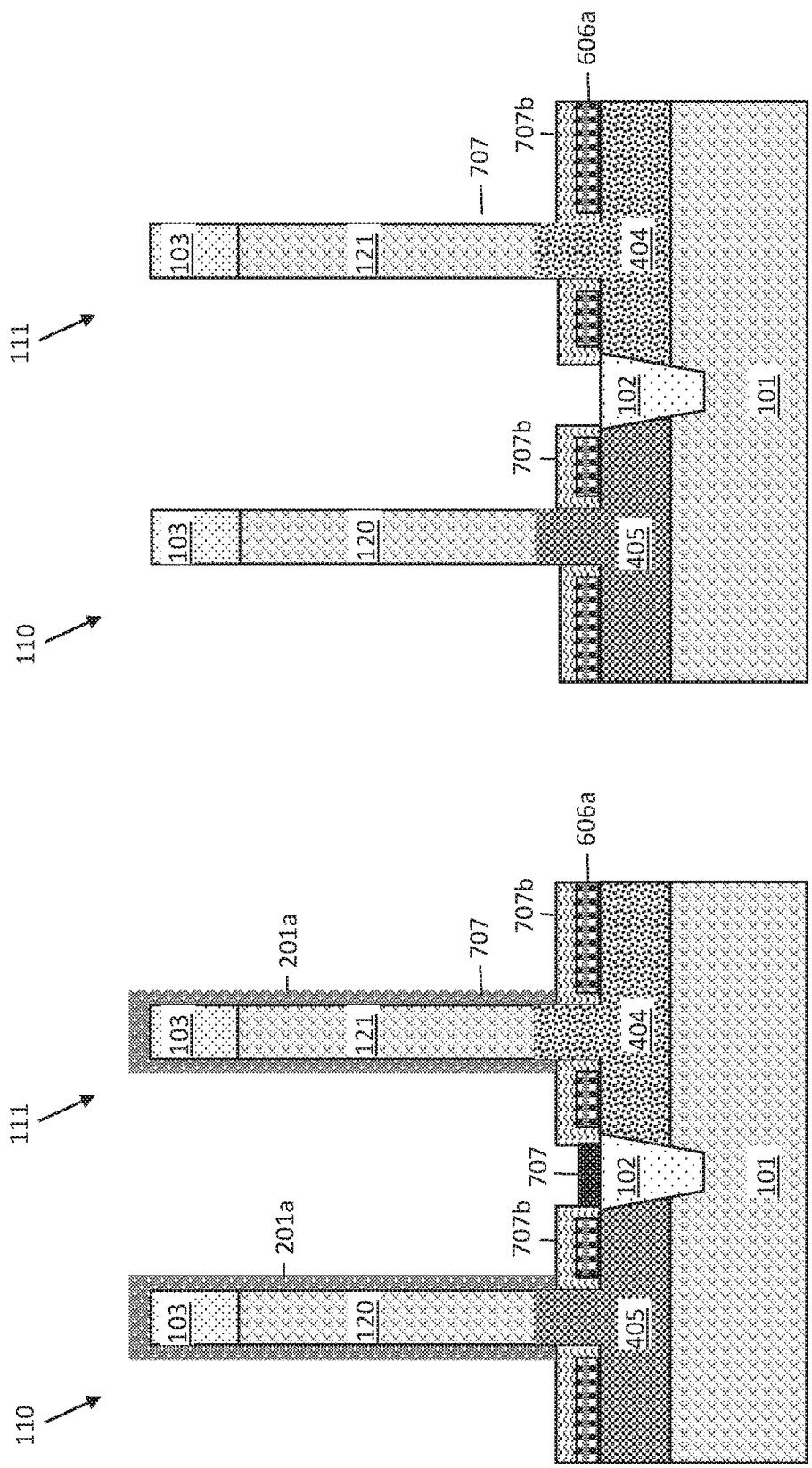

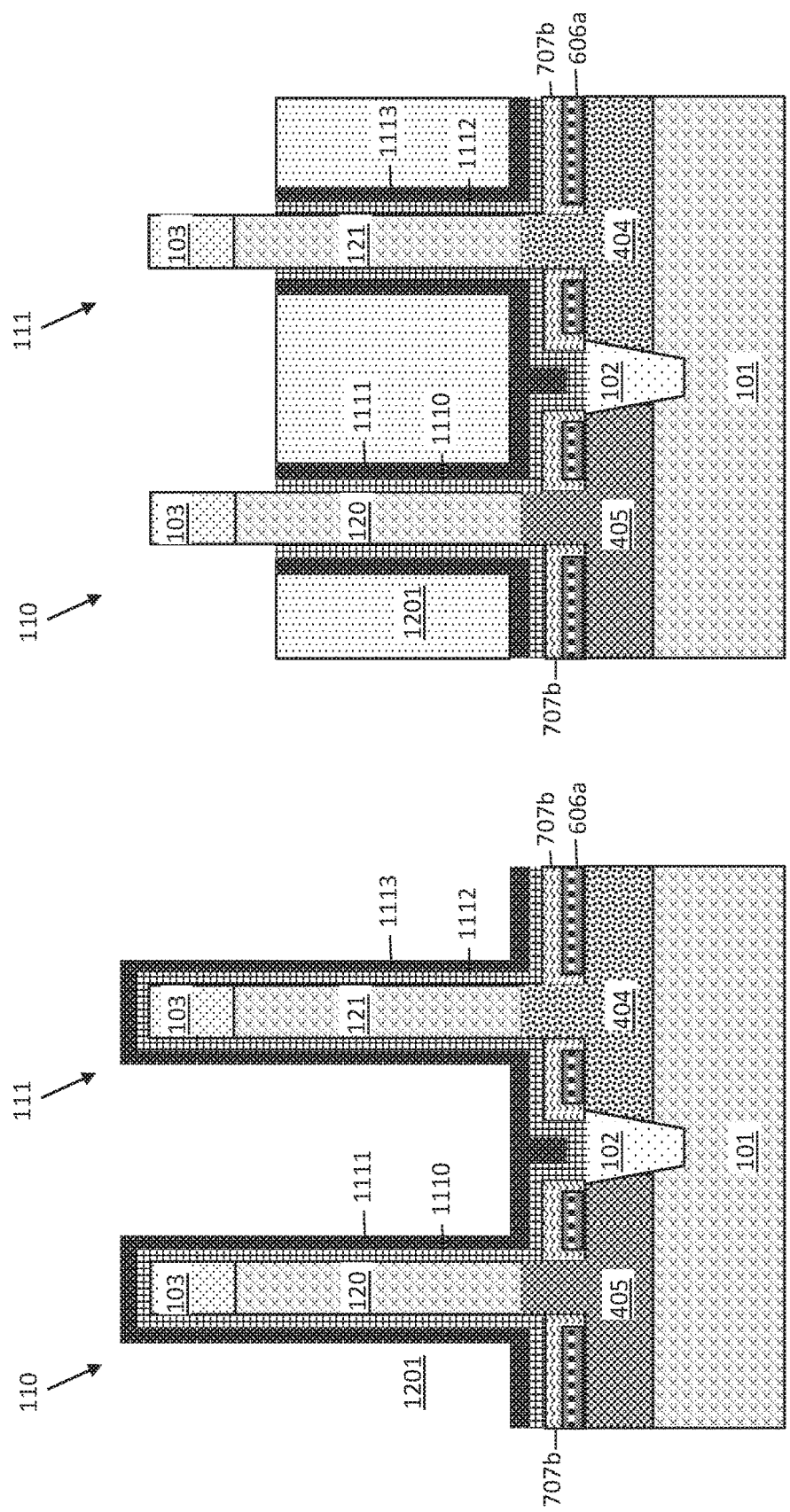

US 10,439,043 B2

FORMATION OF SELF-ALIGNED BOTTOM SPACER FOR VERTICAL TRANSISTORS

DOMESTIC PRIORITY

This application is a divisional of U.S. application Ser. No. 15/848,861, filed Dec. 20, 2017, the contents of which are incorporated by reference herein in its entirety.

The present invention generally relates to fabrication methods and resulting structures for semiconductor devices. More specifically, the present invention relates to formation of a self-aligned bottom spacer for vertical transistors.

Semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

SUMMARY

Embodiments of the present invention are directed to a method for fabricating a semiconductor device. A non-limiting example of the method includes forming a fin on a substrate. Source/drain regions are arranged on the substrate on opposing sides of the fin. The method includes depositing a semiconductor layer on the source/drain regions. The method includes depositing a germanium containing layer on the fin and the semiconductor layer. The method further includes applying an anneal operation configured to chemically react the semiconductor layer with the germanium containing layer and form a silicon oxide layer.

Another non-limiting example of the method includes forming a fin on a substrate. Source/drain regions are arranged on the substrate on opposing sides of the fin. The method includes depositing a first silicon germanium layer on the source/drain regions. The method includes depositing a germanium containing layer on the fin and the first silicon germanium layer. The method further includes annealing to chemically react the first silicon germanium layer with the germanium containing layer and form a silicon oxide layer arranged on a second silicon germanium layer with an increased germanium content than the first silicon germanium layer. The method includes performing a nitridation process to increase a nitrogen content of the silicon oxide layer and form a bottom spacer.

Another non-limiting example of the method includes depositing a first silicon germanium layer on a source/drain region arranged on a substrate. The method includes depositing a germanium oxide layer on the fin and the first silicon germanium layer. The method further includes reacting, chemically, the first silicon germanium layer with the germanium oxide layer to form a silicon oxide layer arranged on a second silicon germanium layer with an increased germanium content than the first silicon germanium layer.

Embodiments of the invention are directed to a semiconductor device. A non-limiting example of the semiconductor device includes a fin arranged on a substrate. The semiconductor device includes a source/drain region arranged on the substrate adjacent to the fin. The semiconductor device further includes a bottom gate spacer including a silicon germanium layer arranged on the source/drain region and a silicon oxynitride layer arranged on the silicon germanium layer.

Another non-limiting example of the semiconductor device includes a fin arranged on a substrate and a germanium containing layer arranged on a sidewall of the fin. The semiconductor device includes a source/drain region arranged on the substrate adjacent to the fin. The semiconductor device further includes a bottom gate spacer including a silicon oxide layer and a silicon germanium layer arranged on the source/drain region.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-22 depicts a method for fabricating a semiconductor device according to embodiments of the invention, in which:

FIG. 1 depicts a cross-sectional side view of a semiconductor device with fins formed on a substrate;

FIG. 2 depicts a cross-sectional side view after depositing a fin spacer layer on the fins;

FIG. 3 depicts a cross-sectional side view recessing the fin;

FIG. 4 depicts a cross-sectional side view after depositing a semiconductor material;

FIG. 5 depicts a cross-sectional side view after annealing;

FIG. 6 depicts a cross-sectional side view after depositing a sacrificial layer;

FIG. 7 depicts a cross-sectional side view after depositing a germanium containing layer;

FIG. 8 depicts a cross-sectional side view after annealing;

FIG. 9 depicts a cross-sectional side view after performing a nitridation process;

FIG. 10 depicts a cross-sectional side view after removing the germanium containing layers from the fins;

FIG. 11 depicts a cross-sectional side view after pre-cleaning and depositing a gate dielectric layer and work function metal layer;

FIG. 12 depicts a cross-sectional side view after depositing a planarization layer and patterning the gate stack;

FIG. 13 depicts a cross-sectional side view after removing the planarization layer and depositing a dielectric layer;

FIG. 14 depicts a cross-sectional side view after depositing an oxide layer;

FIG. 15 depicts a cross-sectional side view after forming a top spacer;

FIG. 16 depicts a cross-sectional side view after isolating the transistors;

FIG. 17 depicts a cross-sectional side view after depositing an oxide layer;

FIG. 18 depicts a cross-sectional side view after recessing the oxide layer;

FIG. 19 depicts a cross-sectional side view after depositing a semiconductor layer;

FIG. 20 depicts a cross-sectional side view after depositing a liner and another oxide layer;

FIG. 21 depicts a cross-sectional side view after forming contacts according to embodiments; and FIG. 22 depicts a cross-sectional side view after forming contacts according to embodiments.

Figure 1:
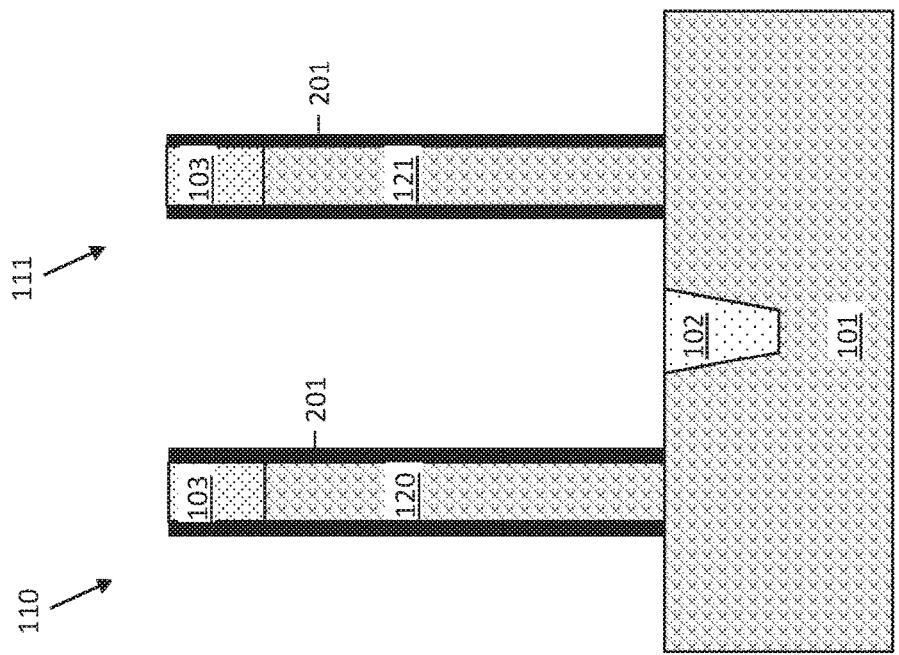

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, as MOSFETs are scaled to smaller dimensions, various designs and techniques are employed to improve device performance. Vertical transistors, in which source/drain regions are arranged on opposing ends of a vertical channel region (or fin) surrounded by a gate are attractive candidates for scaling to smaller dimensions. Vertical transistors thus can provide higher density scaling that alleviate middle-of-line (MOL) fabrication complexity.

In vertical transistors, top and bottom gate spacers are arranged between the gate and the top and bottom source/drain regions, respectively. The gate spacers can include silicon nitride and/or silicon oxide, both of which can present challenges. Silicon nitride spacers can be formed using high density plasma (HDP), which can cause nitridation of the silicon oxide sidewall liner of the fin channel, forming SiON on the fin sidewalls. SiON on the fin sidewalls can be difficult to remove by etching, which can also lead to non-selective etching of the bottom spacer and fin hard mask, which both include silicon nitride. Although using silicon oxide for the bottom spacer can avoid the aforementioned nitridation of the fin sidewalls and resulting etch non-selectivity, using silicon oxide presents another set of challenges. After silicon oxide is deposited on the substrate and fin and etched back to form the bottom spacer, the shape of the spacer can be meniscus shaped at the interface of the fin with the substrate, which can lead to the loss of gate controllability. For these reasons, a silicon nitride bottom spacer is preferable.

Turning now to an overview of the aspects of the invention, one or more embodiments of the invention address the above-described shortcomings of the prior art by providing a method for forming a SiON bottom spacer. In embodiments of the invention, the SiON bottom spacer is formed by reacting germanium oxide ($GeO_2$) with silicon germanium (SiGe) and annealing to form a silicon oxide ($SiO_2$) bottom spacer layer. The silicon oxide layer is nitrided to form the SiON bottom spacer.

The above-described aspects of the invention address the shortcomings of the prior art by providing a simple and effective method to ensure substantially equivalent and uniform thicknesses for the SiON bottom spacer for both NFET and PFET devices without any patterning. The uniform thickness of the bottom spacer provides a predictable and accurate channel length in the device. The method provides a structure that mitigates the loss of the fin hard mask and bottom spacer during removal of the fin sidewall liner.

Turning now to a more detailed description of aspects of the present invention, FIGS. 1-22 depict a method for fabricating a semiconductor device according to embodiments of the invention. FIG. 1 depicts a cross-sectional side view of a semiconductor device with fins 120, 121 formed on a substrate 101. The first fin 120 is part of a first semiconductor device 120, and the second fin 121 is part of a second semiconductor device. According to an exemplary embodiment, the first semiconductor device 110 is a NFET, and the second semiconductor device 111 is a PFET.

Non-limiting examples of suitable substrate 101 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

The fins 120, 121 each include a hard mask cap 103. The fins 120, 121 can be formed in the substrate 101 by depositing a hard mask material over the substrate 101, followed by patterning and etching. The fins 110 also can be patterned in the substrate by, for example, sidewall imaging transfer.

An isolation region 102 is formed between the active areas of the first transistor 110 and the second transistor 111. The isolation regions 102 can be formed by any known method in the art, including, for example, lithography and etching to form trenches in the substrate 101, and then filling the trenches with an insulating material, such as silicon dioxide. After forming isolation region 102, an active region is defined as the region between a pair of isolation regions. According to one or more embodiments, the isolation region 102 is a shallow trench isolation region (STI). However, the isolation region can be a trench isolation region, a field oxide isolation region (not shown), or any other equivalent known in the art. The isolation region 102 provides isolation between neighboring gate structure regions, and can be used when the neighboring gates have opposite conductivities, such as NFETs and PFETs. As such, the at least one isolation region can separate an NFET device region from a PFET device region.

Figure 2:
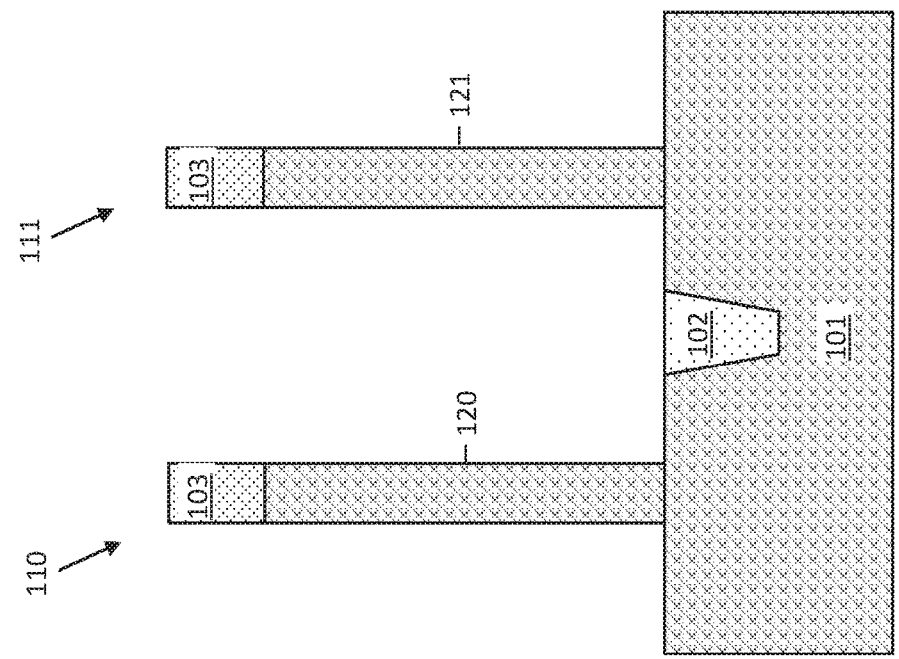

FIG. 2 depicts a cross-sectional side view after depositing a fin spacer layer 201 on the fins 120, 121. The fin spacer layer 201 is a protective layer spacer on sidewalls of the fins 120, 121. After depositing the fin spacer layer 201 on the fins 120, 121, the fin spacer layer 201 is etched to expose the top surface of the fins 120, 121 (or the hard mask caps 103).

Non-limiting examples of materials for the fin spacer layer 201 include dielectric oxides (e.g., silicon oxide), dielectric nitrides (e.g., silicon nitride), dielectric oxynitrides, or any combination thereof. The spacer material is deposited by a deposition process, for example, chemical vapor deposition (CVD) or physical vapor deposition (PVD). The spacer material can be etched by a dry etch process, for example, a RIE process.

Figure 3:
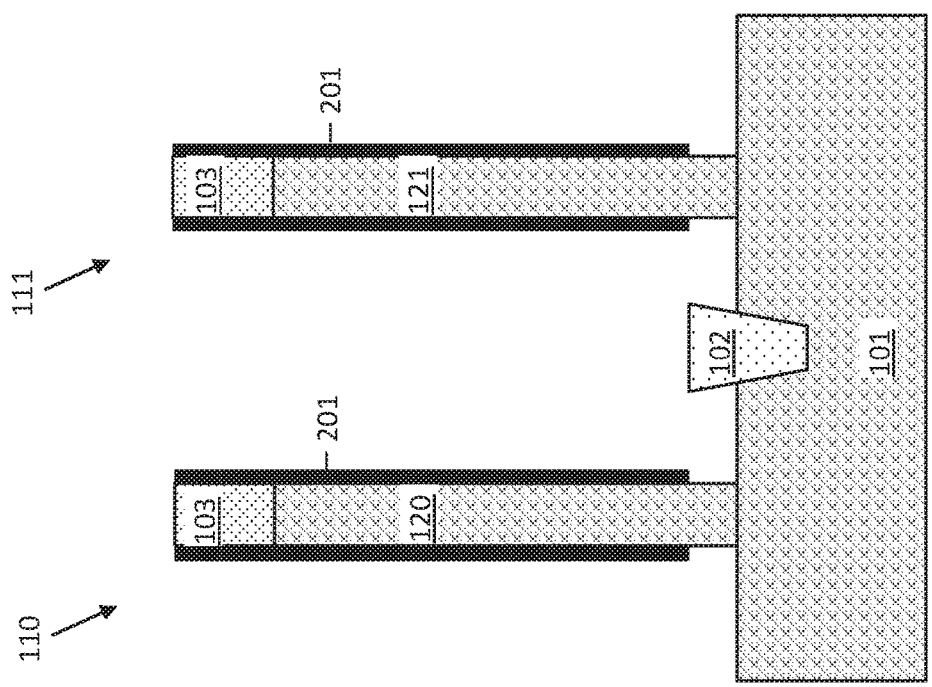

FIG. 3 depicts a cross-sectional side view recessing the fins 120, 121. The bottom portions of the fins 120, 121 are recessed, at interface with the substrate 101. The fin spacer layer 201 remains in place to protect the active fin and avoid bottom source/drain formation from the sidewall surface of the fins 120, 121 (see FIG. 4). The substrate 101 surface is vertically etched to expose the sidewall surfaces of the fins 120, 121.

Figure 4:
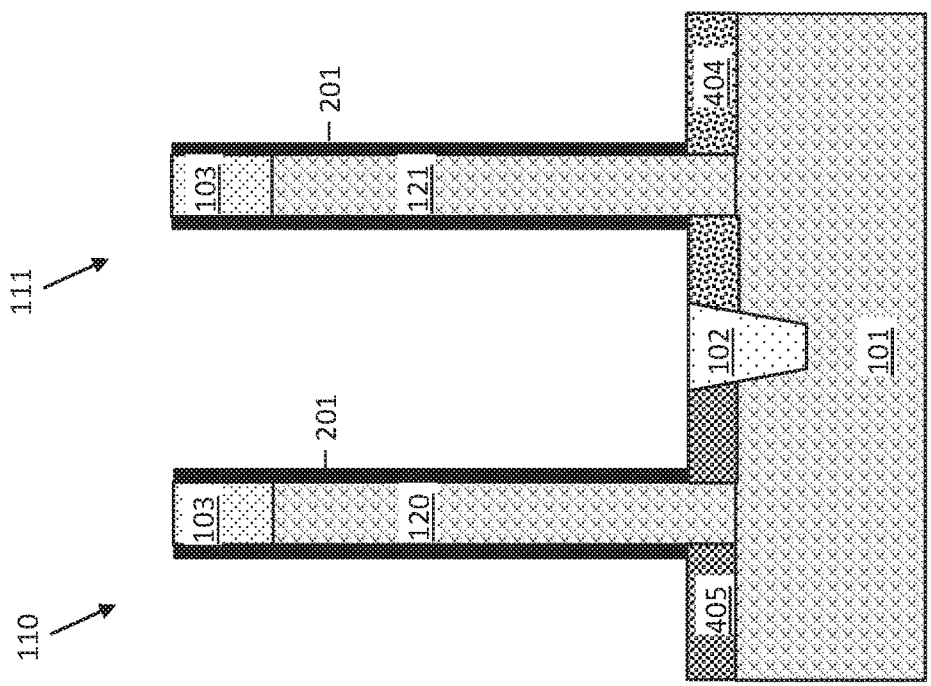

FIG. 4 depicts a cross-sectional side view after depositing a semiconductor material 404, 405 on the substrate 101 to form bottom source/drains. The semiconductor material 405 forms the bottom source/drain of the first transistor 110, and the semiconductor material 404 forms the bottom source/drain of the second transistor 111.

According to one or more embodiments, the semiconductor material 404, 405 is epitaxially grown semiconductor material. The fin spacer layer 201 on the fin sidewalls protects the fins from deposition of semiconductor material during the epitaxial growth process. Epitaxial layers can be grown from gaseous or liquid precursors. Epitaxial growth can be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C), for example, can be doped during deposition by adding a dopant or impurity to form a silicide. The semiconductor material 404, 405 is doped with an n-type dopant (e.g., phosphorus, arsenic, or antimony) or a p-type dopant (e.g., boron), depending on the type of transistor.

In some exemplary embodiments, the first transistor 110 is an NFET, and the semiconductor material 405 is epitaxially grown silicon doped with phosphorus. In other exemplary embodiments, the second transistor 111 is a PFET, and the semiconductor material 404 is epitaxially grown silicon germanium doped with boron.

FIG. 5 depicts a cross-sectional side view after annealing. Annealing is performing to drive the dopants from the semiconductor material 404, 405 into the substrate 101 and fins 120, 121 at the source/drain junction. Source/drain regions are arranged on the substrate 101 on opposing sides of each fin 120, 121.

The annealing is performed by, for example, heating inside a furnace or performing a rapid thermal treatment in an atmosphere containing pure inert gases (e.g., nitrogen or argon). The anneal process can be, for example, a rapid thermal anneal (RTA) or rapid thermal processing (RTP).

FIG. 6 depicts a cross-sectional side view after depositing a sacrificial layer 606 on the semiconductor material 404, 405 of the source/drain regions. The sacrificial layer 606 is an un-doped semiconductor material and is formed on the source/drain regions of first transistor 110 and second transistor 111. The sacrificial layer 606 is deposited on the semiconductor material 404, 405 and of both transistors.

According to one or more embodiments, the sacrificial layer 606 is epitaxially grown silicon germanium that is undoped. According to some embodiments, the silicon germanium layer comprises about 20 to about 40 atomic % germanium. According to other embodiments, the silicon germanium layer comprises about 20 to about 60 atomic % germanium. Because other exposed surfaces are covered by dielectrics, epitaxial growth on other exposed surfaces, including the isolation region 102, does not occur.

Figure 7:
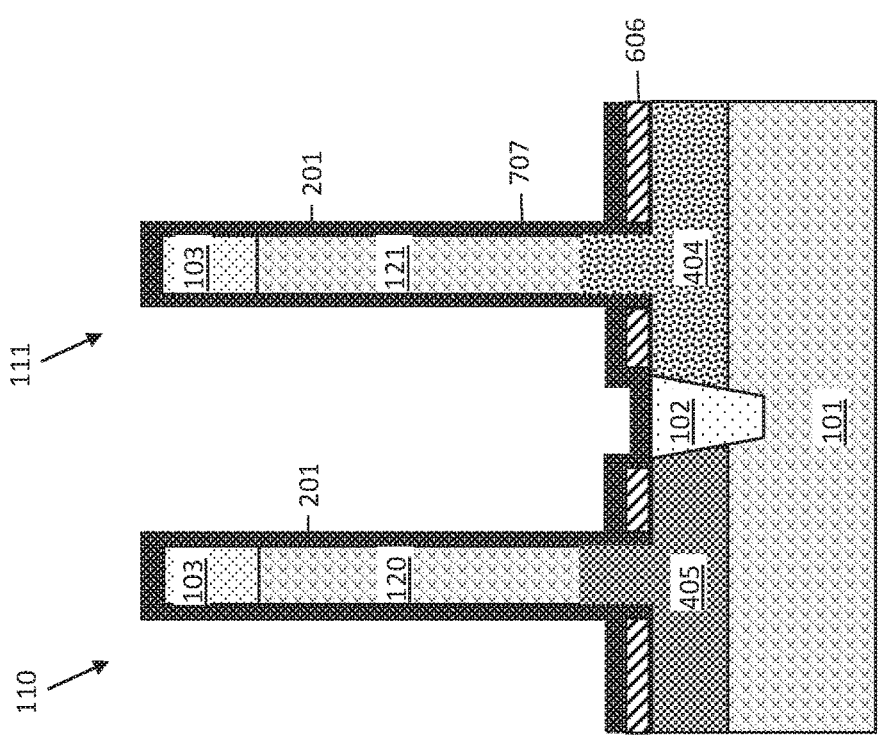

FIG. 7 depicts a cross-sectional side view after depositing a germanium containing layer 707 on the fins 120, 121 and the sacrificial layer 606 on the source/drain regions. The germanium containing layer 707 is conformal.

According to one or more embodiments, the germanium containing layer is deposited by atomic layer deposition (ALD) and includes germanium oxide ($GeO_2$). The thickness of the germanium containing layer 707 generally varies and is not intended to be limited. Yet, according to some embodiments, the germanium containing layer 707 has a thickness of about 4 to about 8 nm.

Figure 8:
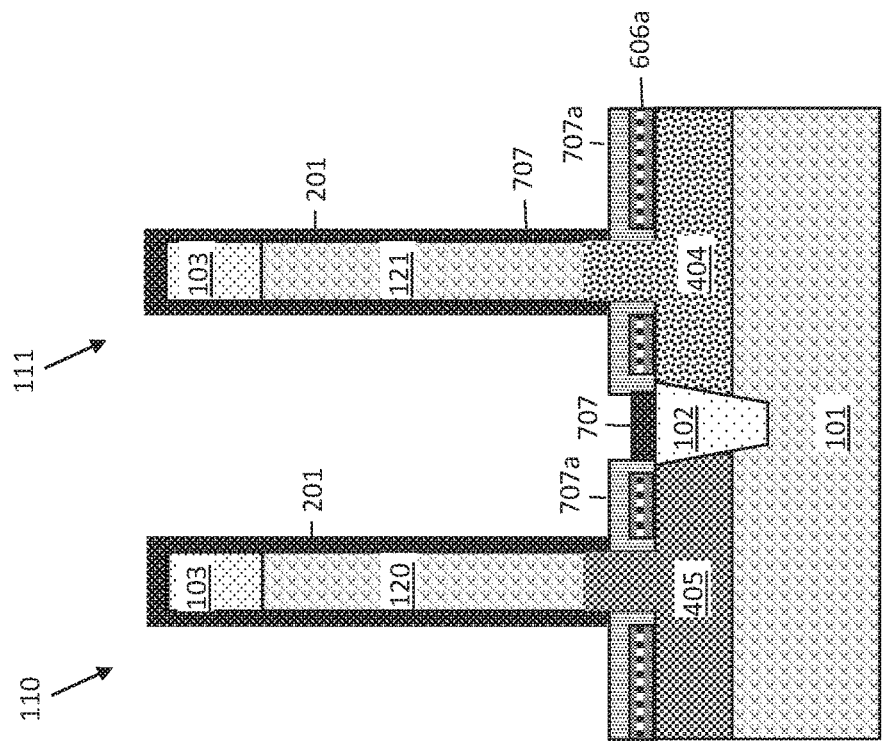

FIG. 8 depicts a cross-sectional side view after annealing. Annealing induces a chemical reaction between the materials of the sacrificial layer 606 and materials of the germanium containing layer 707, forming layers 707a and 606a. Layers 606a and 707a each include a chemical reaction product that results from reaction of sacrificial layer 606 and germanium containing layer 707. The germanium containing layer 707 on the sidewalls of the fins 120, 121 remains unreacted.

The annealing is performed by, for example, heating inside a furnace or performing a rapid thermal treatment in an atmosphere that includes pure inert gases (e.g., nitrogen or argon). In exemplary embodiments, annealing is performed at about 400 to about 650° C., for about 1 to 30 seconds in an ambient $N_2$ environment.

In some exemplary embodiments, before annealing, the sacrificial layer 606 includes silicon germanium with 40 atomic % germanium, and the germanium containing layer 707 includes germanium oxide. After annealing, the germanium content of the silicon germanium layer increases by about 20 to 30 atomic % to form layer 606a, which includes silicon germanium with 60 to 70 atomic % germanium. After annealing, layer 707a then includes a top layer of substantially pure silicon oxide ($SiO_2$). The following reaction occurs embodiments: $SiGe40\%+2GeO_2$ $SiGe60\%+SiO_2+2GeO$. The GeO is a volatile species.

In other exemplary embodiments, the sacrificial layer 606 includes silicon germanium with about 20 to about 60 atomic % germanium, and after annealing, the germanium content of the silicon germanium layer increases to form layer 606a, with about 40 to about 80 atomic % germanium. The germanium from the germanium containing layer 707 moves down into the sacrificial layer 606 (forming layer 606a), and a pure silicon oxide layer is formed on the top surface, which will be further processed to form the bottom gate spacer.

FIG. 9 depicts a cross-sectional side view after, optionally, performing a nitridation process. The nitridation process adds nitrogen to the germanium containing layer 707 on the fin sidewalls, forming layer 201a, and to layer 707a on the source/drain regions, forming layer 707b. According to one or more embodiments, the layer 201a includes germanium oxynitride (GeON), and layer 707b includes SiON. Adding nitrogen to silicon oxide to form SiON is advantageous because it is more stable than silicon oxide. The layer 201a including GeON on the fin sidewalls is also easily washed away to expose the fins 120, 121.

According to some embodiments, the nitridation process is performed by rapid thermal nitridation (RTN) at low temperatures. The RTN can be performed at temperatures, for example, of about 600 to about 800° C. in an ambient atmosphere, for example, in NH$_3$. According to other embodiments, the nitridation process is performed by plasma nitridation.

FIG. 10 depicts a cross-sectional side view after removing layer 201a from the fin sidewalls. When layer 201a includes GeON, layer 201 can be removed by, for example, washing/etching with deionized water. The fin 120, 121 sidewalls and hard masks 103 are then exposed, leaving layer 707b on the source/drain regions. Layer 707b will form the bottom gate spacer.

FIG. 11 depicts a cross-sectional side view after pre-cleaning and depositing gate dielectric layers 1110, 1112 and work function metal layers 1111, 1113. Gate dielectric layers 1110, 1112 and work function metal layers 1111, 1113 are part of the gate stack.

Before depositing the gate stack layers, pre-cleaning is performed to remove chemical residue. The pre-cleaning process can include a light, non-selective, non-reactive etch, such as a plasma etch. According to some embodiments, the pre-cleaning includes hydrofluoric acid (HF) and hydrochloric acid (HCl).

The gate dielectric layers 1110, 1112 and work function metal layers 1111, 1113 are specific for the type of transistor. The gate dielectric material(s) can be a dielectric material having a dielectric constant greater than about 3.9, about 7.0, or about 10.0. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The work function metal layers 1111, 1113, are disposed over the gate dielectric material. The type of work function metal(s) depends on the type of transistor and can differ between the first transistor 110 and second transistor 111. Non-limiting examples of suitable work function metals include p-type work function metal materials and n-type work function metal materials. P-type work function materials include compositions such as titanium nitride (TiN), tantalum nitride (TaN), ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

FIG. 12 depicts a cross-sectional side view after depositing a planarization layer 1201 and patterning the gate stack. The planarization layer 1201 can be a spin-on coating, or an organic planarization layer (OPL). The planarization layer 1201 is deposited on the fins 120, 121 and substrate 101 and then recessed, for example, by etching. The gate dielectric layers 1110, 1112 and work function metal layers 1111, 1113 are exposed and can be etched by one or more etch processes such that they are recessed below the hard mask caps 103, if needed.

Figure 13:
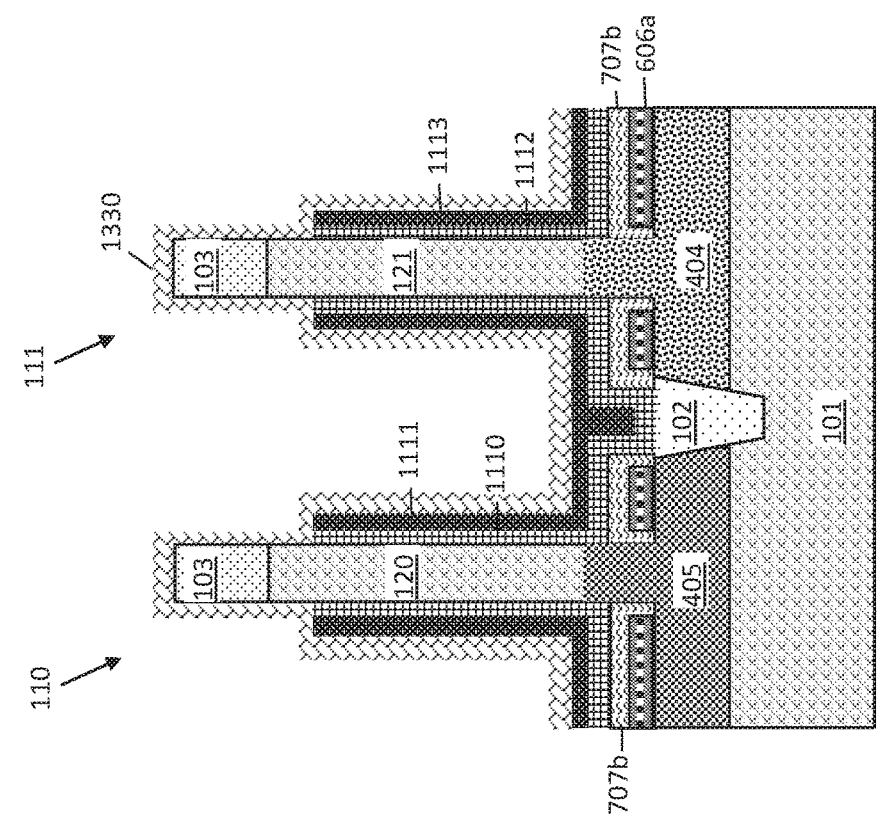

FIG. 13 depicts a cross-sectional side view after removing the planarization layer 1201 and depositing a dielectric layer 1330. The dielectric layer 1330 encapsulates the fins 120, 121 and gate stacks around the fins. According to one or more embodiments, the dielectric layer 1330 includes dielectric oxides (e.g., silicon oxide), dielectric nitrides (e.g., silicon nitride), dielectric oxynitrides, or any combination thereof.

Figure 14:
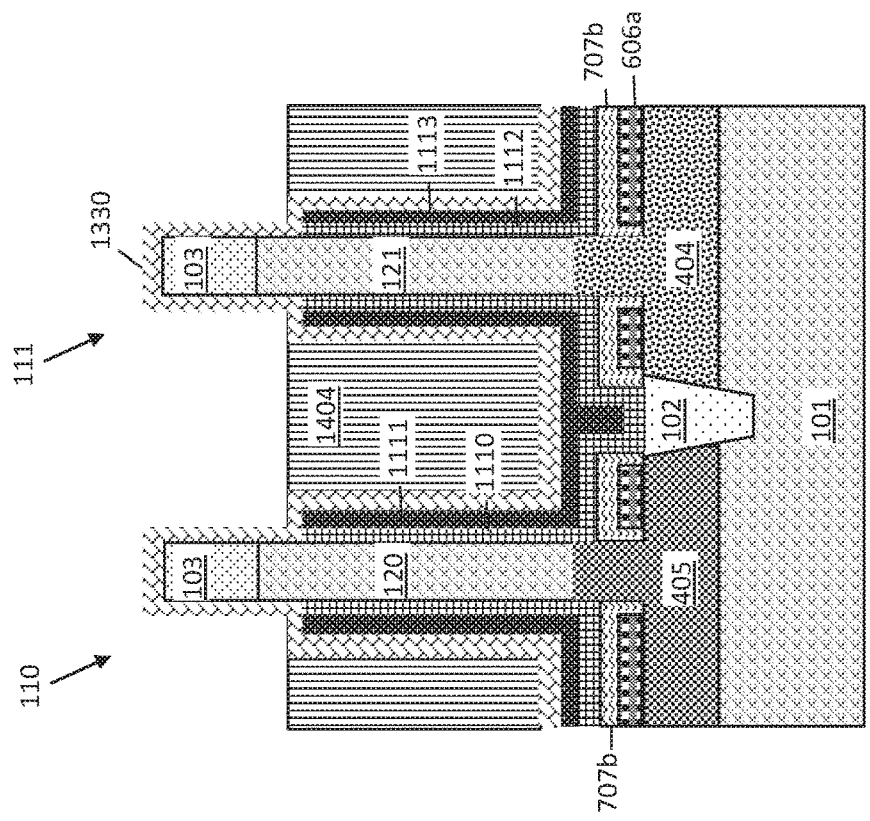

FIG. 14 depicts a cross-sectional side view after depositing an oxide layer 1404 (inter layer dielectric (ILD)). The oxide layer 1404 can include, but is not limited to, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The oxide layer 1404 is partially recessed below the level of the hard mask caps 103 on the fins 120, 121.

Figure 15:
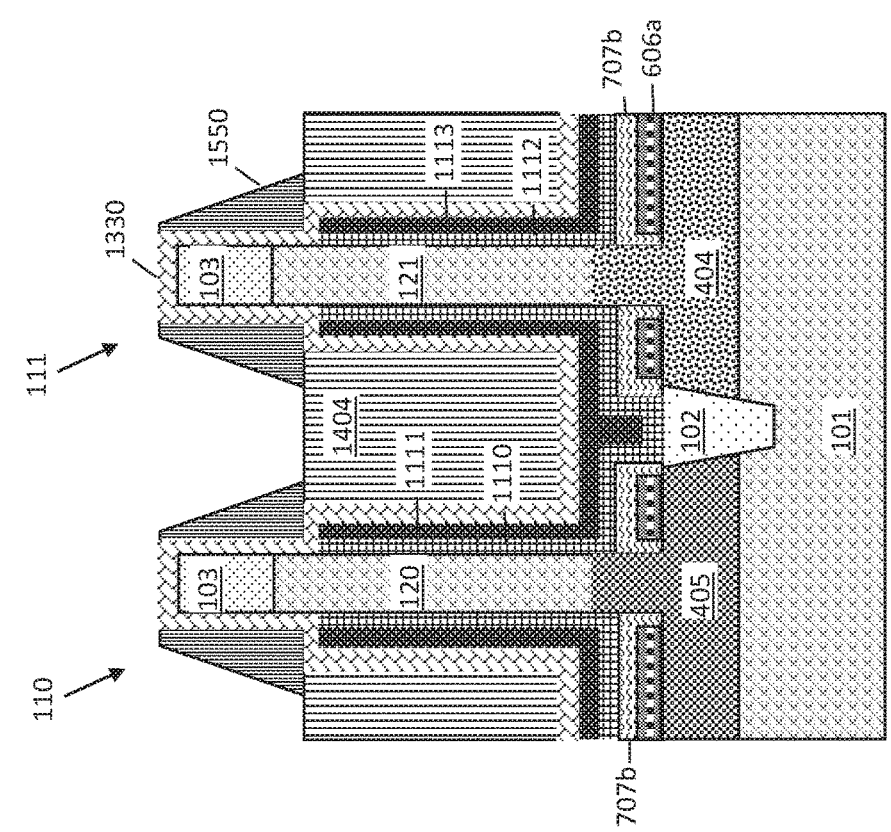

FIG. 15 depicts a cross-sectional side view after forming a top spacer 1550 on top of the gate stack. The top spacer 1550 includes an insulating material, for example, silicon dioxide, silicon nitride, SiOCN, or SiBCN. Other non-limiting examples of materials for the top spacer 1550 include dielectric oxides (e.g., silicon oxide), dielectric nitrides (e.g., silicon nitride), dielectric oxynitrides, or any combination thereof. After being deposited, the spacer material is etched.

Figure 16:
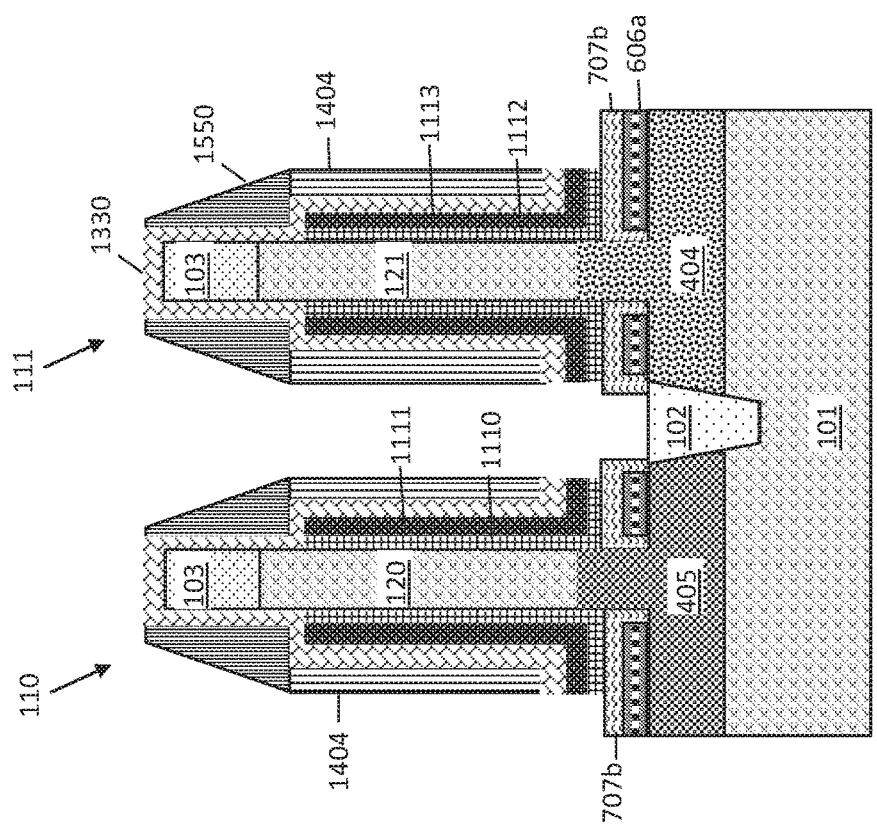

FIG. 16 depicts a cross-sectional side view after isolating the two transistors, 110 and 111. The oxide layer 1404 is etched, using the top spacers 1550 as a pattern. Portions of the gate dielectric layers 1110, 1112, work function metal layers 1111, 1113, and dielectric layer 1330 are removed over the isolation region 102 between the transistors 110, 111, exposing the isolation region 102.

Figure 17:
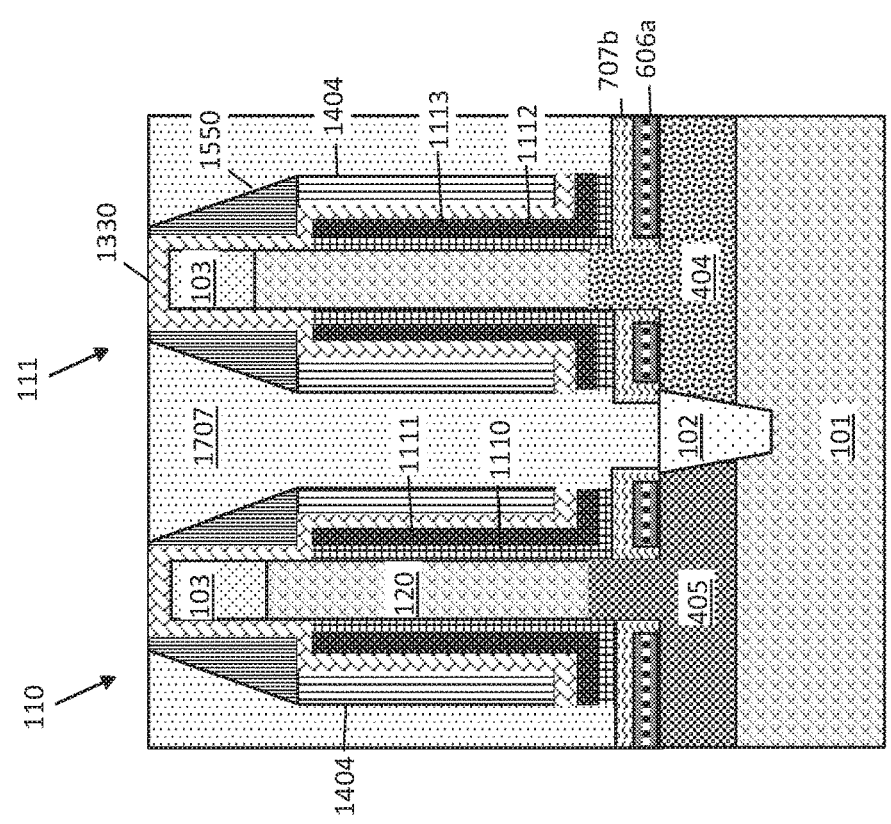

FIG. 17 depicts a cross-sectional side view after depositing an oxide layer 1707. The oxide layer 1707 can include, but is not limited to, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

Figure 18:
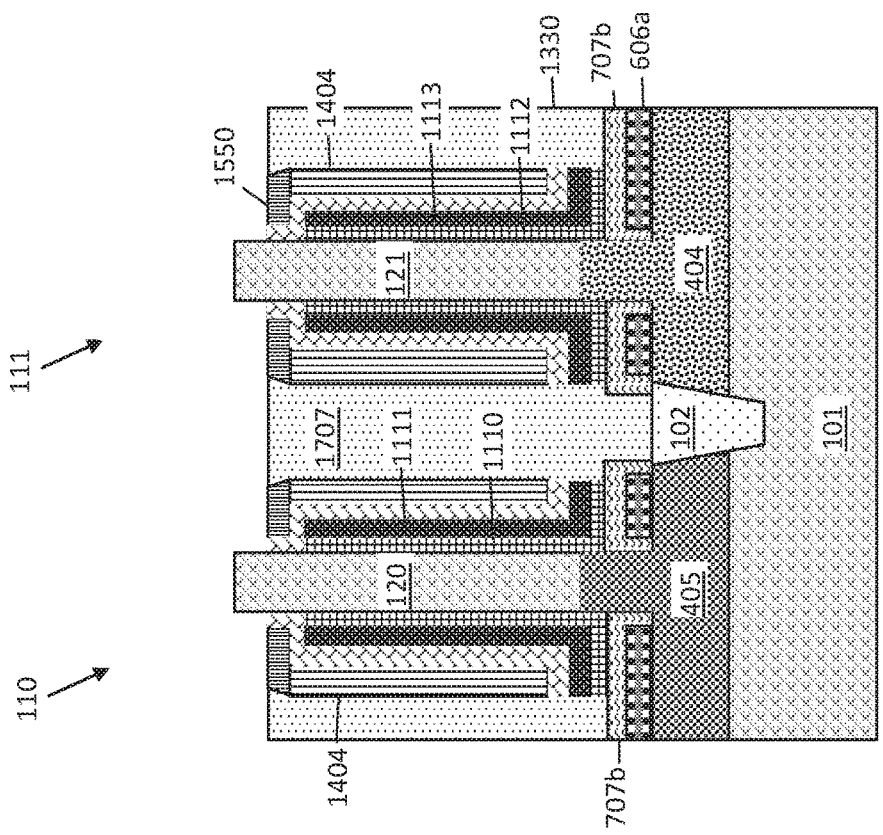

FIG. 18 depicts a cross-sectional side view after recessing the oxide layer 1707. The oxide layer 1707 is recessed to a level below the fin hard mask caps 103. The hard mask caps 103 are also removed, and the top spacers 1550 are also partially recessed to expose the tops of the fins 120, 121, where the top source/drains will be formed.

Figures 19, 20:
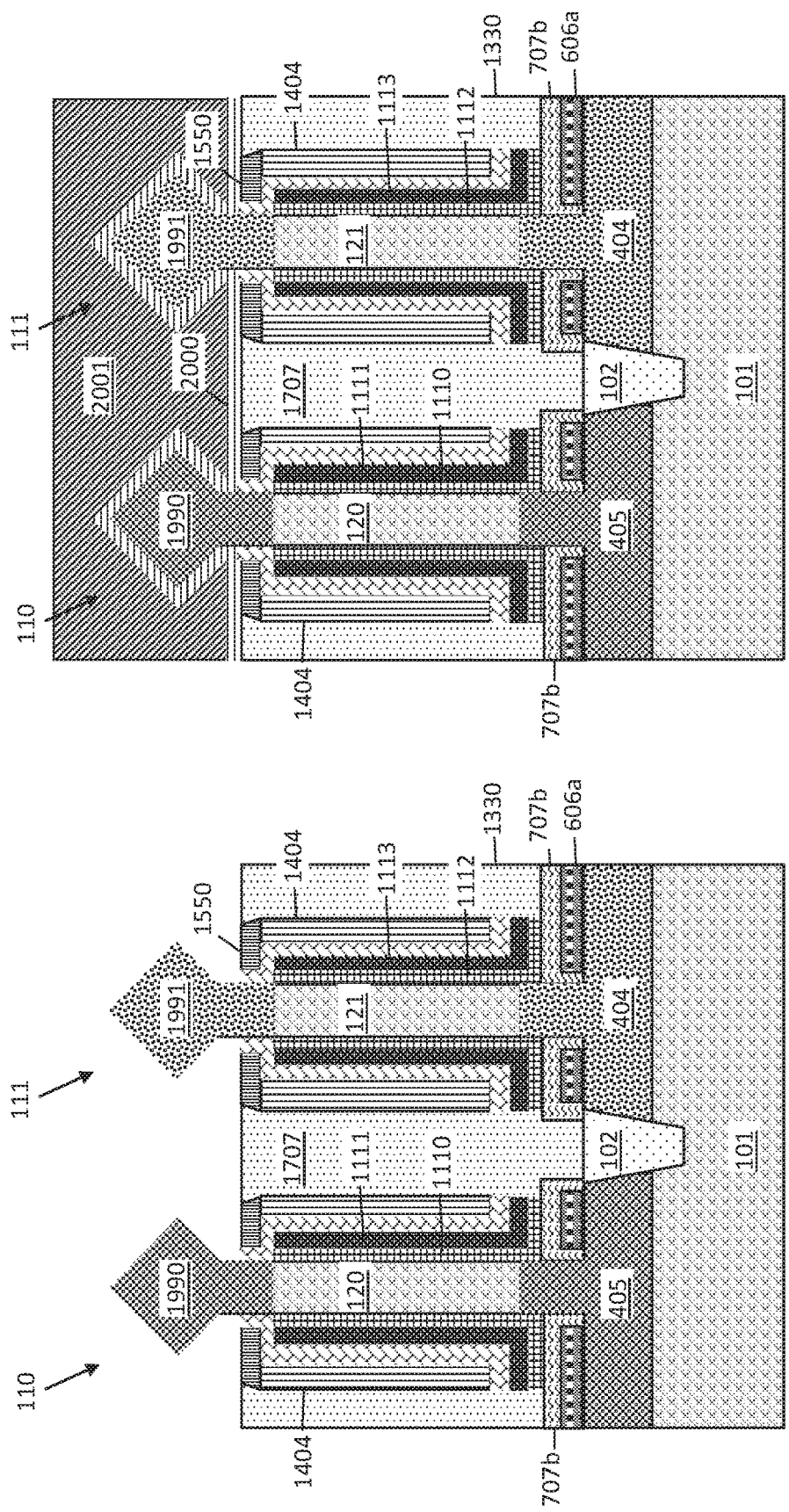

FIG. 19 depicts a cross-sectional side view after depositing a semiconductor layers 1990, 1991 on the fins 120, 121, respectively. The semiconductor material 1990, 1991 forms the top source/drains and can include epitaxial semiconductor material, as described above with respect to FIG. 4. The epitaxial semiconductor material can include dopants, and annealing can be used to drive in the dopants into the fins 120, 121 at the top source/drain regions, as described above with respect to FIG. 5.

FIG. 20 depicts a cross-sectional side view after depositing a liner 2000 and another oxide layer 2001 (ILD) on the top source/drain. The liner 2000 encapsulates the source/drains. The liner 2000 is used as an etch stop liner when the top source/drain contacts are formed.

Figure 21:
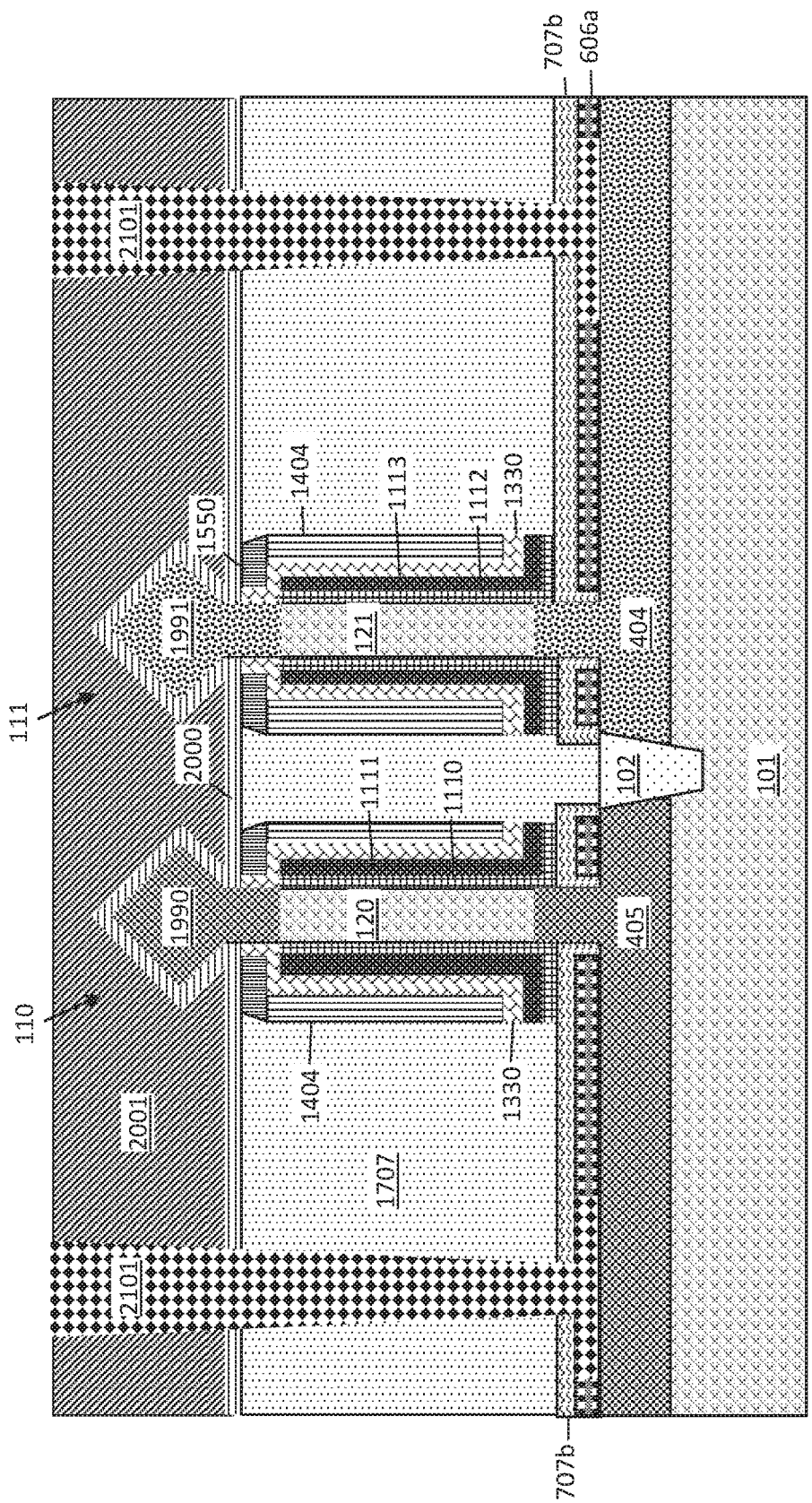

FIG. 21 depicts a cross-sectional side view after forming bottom contacts 2101 (source/drain contacts) according to embodiments. The layer 606a, which includes a high or increased germanium content can be selectively etched to provide a large contact area for the bottom contacts 2101. The bottom contacts 2101 are formed in the oxide layers 2001, 1707 by etching trenches. The bottom source/drain contacts 2101 extend through the oxide layers 2001, 1707 and to semiconductor material 404, 405 that form the bottom source/drain regions. A resist, such as a photoresist, can be deposited and patterned to form the contact trenches. An etch process, such as a RIE, is performed to remove the oxide layers 2001, 1707, layer 707b, and layer 606a. The contact trenches are filled with a conductive material or a combination of conductive materials. Because layer 606a includes a high germanium content, layer 606a functions as an etch stop layer. More of layer 606a will be removed during the etch process, which results in formation of an inverted "T" shaped contact. The etch process will stop on the semiconductor material 404, 405. A conductive material is deposited in the trenches, such as a conductive metal, for example, aluminum (Al), platinum (Pt), gold (Au), tungsten (W), titanium (Ti), cobalt (Co), or any combination thereof.

Figure 22:
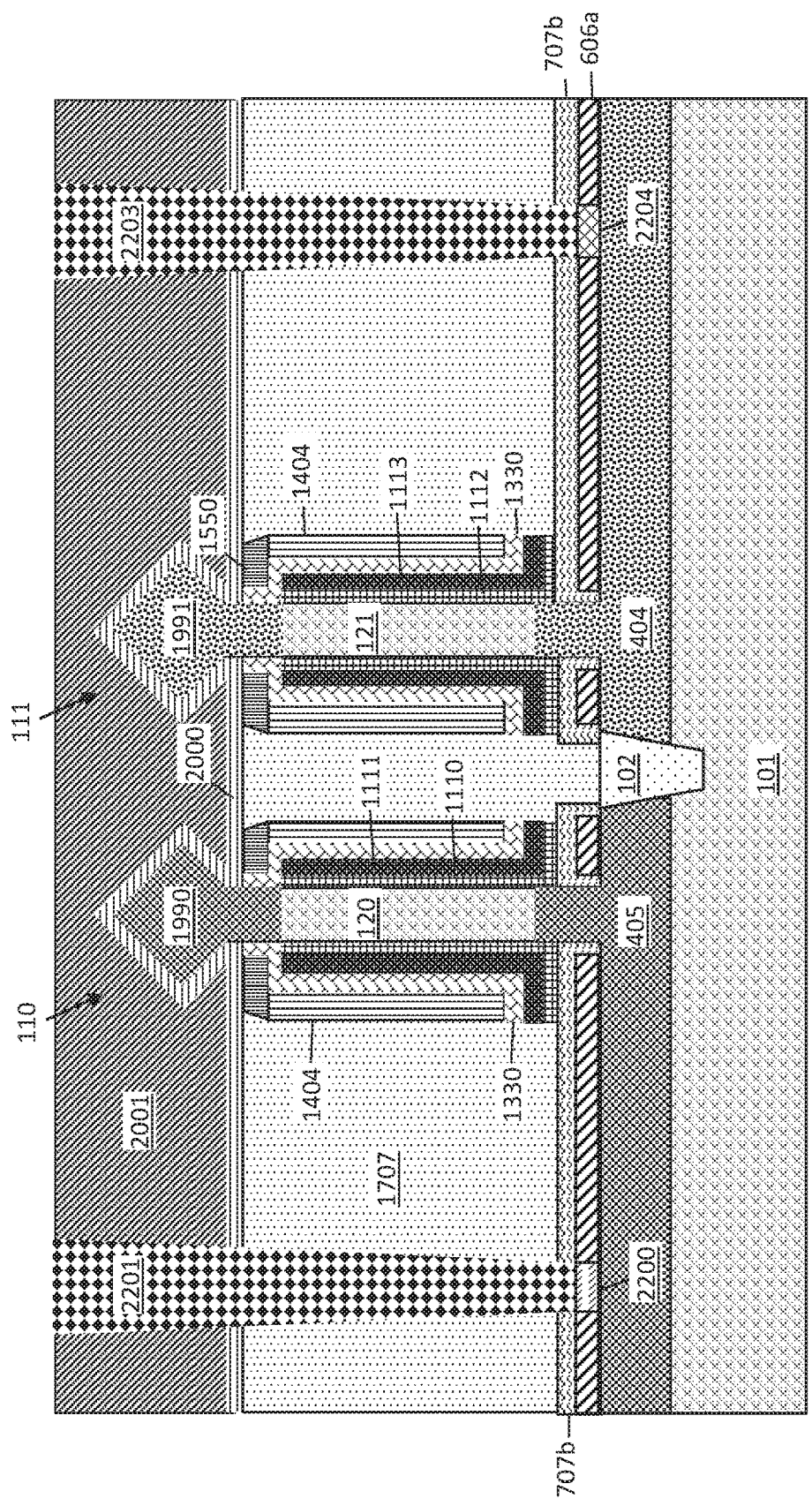

FIG. 22 depicts a cross-sectional side view after forming bottom contacts 2201, 2203 according to embodiments. After forming trenches in the oxide layers 2001, 1707, and before depositing the contact metals, semiconductor materials 2200 and 2204 are deposited on the semiconductor materials 405 and 404, respectively.

The semiconductor materials 2200, 2204 are epitaxially grown semiconductor material according to some embodiments. In one or more embodiments, the epitaxially grown semiconductor material 2200 is the same as semiconductor material 405 in first transistor 110. In some embodiments, semiconductor material 405 and semiconductor material 2200 are silicon doped with phosphorus. In some embodiments, semiconductor material 2204 is epitaxially grown germanium doped with gallium.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:
1. A semiconductor device comprising:
a fin arranged on a substrate;
a source/drain region arranged on the substrate adjacent to the fin; and
a bottom gate spacer comprising a silicon germanium layer arranged on the source/drain region and a silicon oxynitride layer arranged on the silicon germanium layer.
2. The semiconductor device of claim 1, wherein the silicon germanium layer comprises from about 40 to about 80 atomic percentage (%) germanium.
3. The semiconductor device of claim 1, wherein the silicon germanium comprises from about 20 to about 60 atomic percentage (%) germanium.
4. The semiconductor device of claim 2 further comprising a germanium containing layer arranged on sidewalls of the fin.
5. The semiconductor device of claim 3 further comprising a germanium containing layer arranged on sidewalls of the fin.
6. The semiconductor device of claim 4, wherein the germanium containing layer comprises germanium oxynitride.
7. The semiconductor device of claim 5, wherein the germanium containing layer comprises germanium oxynitride.
8. The semiconductor device of claim 4, wherein the germanium containing layer comprises germanium oxide.
9. The semiconductor device of claim 5, wherein the germanium containing layer comprises germanium oxide.
10. The semiconductor device of claim 1 further comprising forming a metal gate on the bottom spacer.
11. A semiconductor device comprising:
a fin arranged on a substrate;
a germanium containing layer arranged on a sidewall of the fin;
a source/drain region arranged on the substrate adjacent to the fin; and
a bottom gate spacer comprising a silicon oxide layer and a silicon germanium layer arranged on the source/drain region.
12. The semiconductor device of claim 11, wherein the silicon germanium layer comprises from about 40 to about 80 atomic percentage (%) germanium.
13. The semiconductor device of claim 11, wherein the silicon germanium comprises from about 20 to about 60 atomic percentage (%) germanium.
14. The semiconductor device of claim 12 further comprising a germanium containing layer arranged on sidewalls of the fin.
15. The semiconductor device of claim 13 further comprising a germanium containing layer arranged on sidewalls of the fin.
16. The semiconductor device of claim 14, wherein the germanium containing layer comprises germanium oxynitride.
17. The semiconductor device of claim 15, wherein the germanium containing layer comprises germanium oxynitride.
18. The semiconductor device of claim 14, wherein the germanium containing layer comprises germanium oxide.
19. The semiconductor device of claim 15, wherein the germanium containing layer comprises germanium oxide.
20. The semiconductor device of claim 11 further comprising forming a metal gate on the bottom spacer.

* * * * *